(12) United States Patent
Carro (10) Patent No.: US 6,208,166 B1
(45) Date of Patent: Mar. 27, 2001

(54) CIRCUIT AND METHOD FOR IMPLEMENTING COMBINATORIAL LOGIC FUNCTIONS

(75) Inventor: Fernando Incertis Carro, Valencia (ES)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/268,086

(22) Filed: Mar. 12, 1999

(30) Foreign Application Priority Data

Nov. 26, 1998 (EP) .................................................. 98480080

(51) Int. Cl.[7] .................................................. H03K 19/00
(52) U.S. Cl. .................................. 326/59; 326/37; 326/112
(58) Field of Search ................................... 326/59, 60, 37, 326/47, 49, 112, 119, 121

(56) References Cited

U.S. PATENT DOCUMENTS 5,013,937 * 5/1991 Aoki ..................................... 307/448

* cited by examiner

Primary Examiner—Michael Tokar
Assistant Examiner—Anh Tran
(74) Attorney, Agent, or Firm—David A. Mims, Jr.

(57) ABSTRACT

A Transfer Logic Cell (TLC) circuit performing non-boolean logic elementary operations between a dual-rail input and a dual-rail output upon assertion of signals on at least one control terminal to operate said circuit into one of four logic modes of operation i.e. a 'PASS', 'LEFT', 'CROSS' or 'RIGHT' mode or in one of two non-logic modes i.e. 'ISOLATION' or 'TRANSPARENT' mode or in any subset of combinations of the herein above modes. And a method for assembling a plurality of TLC circuits to carry out logic functions in an array-like structure.

11 Claims, 8 Drawing Sheets

A: Active Cell
C: Connecting Cell
I: Isolation Cell

Figure 8

CIRCUIT AND METHOD FOR IMPLEMENTING COMBINATORIAL LOGIC FUNCTIONS

FIELD OF THE INVENTION

The present invention relates generally to data processing units and more particularly to a circuit and method for implementing complex combinatorial logic functions under the form of standard series connected transfer logic cells (TLC) circuits.

BACKGROUND ART

The conventional way of implementing boolean logic functions consists in interconnecting elementary logic gates thus, combining them to create more complex functions. Only two types of logic gates are required to build any function regardless of the level of complexity needed. For instance, an AND and an INVERTER, or an OR and an INVERTER operators are sufficient and indeed, products known as "Gate Arrays" or GAs which are large arrays of such logic elements, are commercially available to implement specific user functions. Because of the technologies in use and of the way those functions are realized INVERTER and AND (or OR) are always combined to get the simplest possible elementary piece of logic from which everything can be build, for instance, a 2-way NAND gate. This elementary element is replicated many times on the same GA. Hundreds of thousands of said logic elements, or their equivalent, are commonly available on current GAs up to numbers expressed in millions of gates for the largest. Then, it is up to the user to have them interconnected to implement its specific function so as to produce an Application Specific Integrated Circuit or ASIC. This is a long, error prone and often difficult task to carry out even though many software products such as logic-entry tools, logic simulators and synthesizers are available as an aid to the designer. Therefore, all of what is specific in said designs is embedded in the wiring. Implementing complex functions indeed generates a lot of interconnections between the elementary building blocks up to a point where it may be impossible to actually use all of them. A first limitation in the amount of logic which can actually be implemented in a given Gate Array being reached whenever the wiring channels in a particular area are all exhausted thus, preventing further use of the remaining gates. To overcome this problem providers of ASIC solutions like "LSI LOGIC Corporation", a US company with headquarters in California and a worldwide presence, are now offering products with several layers of metal wiring, up to five in the more recent ones, which demand however, that sophisticated and expensive manufacturing facilities and technologies be put in place. Another limitation brought by the wiring is the upper speed at which a particular circuit can be run. As published on the WEB site of the above company at http://www.lsilogic.com an article, posted on February 97, to promote their newest process technology states, under the subtitle "Performance leads the way", that the five metal layers are for shorter signal paths mentioning that 'signal interconnections contribute more to performance, or lack of thereof, than gate delays'.

Another approach to implementing logic which is often retained consists in using off-the-shelf Field Programmable Gate Arrays (FPGAs). Those devices are designed in an attempt to overcome the main drawback of the previous approach which resides in the high cost and long delays incurred before being in a position of producing, in quantity, devices tailored to the user application. In FPGAs, all the possible wiring between logic blocks preexist and the customization is achieved by enabling those of the connections between blocks that are necessary to realize the user function. Various means are employed to personalize the wiring e.g. while the circuit is operational, series transistors are permanently turn on, from a background memory in which the circuit customization has been loaded, so establishing paths from block outputs to block inputs and creating the logic function for the particular user application. FPGA logic blocks tend to be more complex than the simpler NAND block, or equivalent, of hard wired GAs, in an attempt to overcome the problem of the wiring complexity between blocks, becoming acute since, in this case, interconnections are not simply formed of pieces of metal but have also to go through devices which must be turn on in one way or another to actually create block interconnections. Incidentally, choosing to have a more complex building block triggers another kind of problems because it is often difficult to exploit a significant portion of the logic potential present in the building block which is wasted. Nevertheless, it remains that a significant part of the FPGAs customization still resides in the wiring between blocks and because all wiring possibilities must preexist on these off-the-shelf non-personalized components a lot of wiring channels and interconnecting devices to create any kind of customization must be available even though they are not going to be used in a particular application. Thus, wiring between blocks is, on FPGAs, an even more important factor which prevents generally from using completely all the logic available on the component. Moreover, paths thus created are most of them going through connecting devices which, although they are intrinsically very fast devices, slow down the upper operating speed of the FPGAs as compared to the equivalent hard wired ASIC previously described solutions based on the same technology, without otherwise expending the logic potential offered on the component. Products of this type are, for instance, offered by the US company "XILINX" with headquarters in California and a world wide representation. On their WEB site, at http://www.xilinx.com, application notes on the subject of wiring and performance such as the following one untitled "XC4000EX Routing: A Comparison with XC4000E and ORCA" published Nov. 17, 1996 (version 1.2) and "Speed Metrics For High-performance FPGAs" published November, 1997 (Application brief XBRF015) clearly testify of the difficulty of achieving a good wiring and of the direct impact of it on performance.

Thus, a major problem when implementing logic is the capability to realize the numerous connections between the generally simple logic blocks available on a standard Gate Array or the more complex ones of FPGAs. In both cases, for a given technology and process, the wiring is the major contributor in limiting the quantity of logic that can actually be used and the speed at which the logic will be able to operate.

OBJECT OF THE INVENTION

It is an objective of the invention to propose a new transfer logic cell, having an intrinsic logic potential higher than simple boolean NOR or NAND gates used by standard Gate Arrays, however far less complex than the kind of building blocks used in FPGAs so as to prevent part of the logic resources available in these building blocks from being often wasted.

It is a further objective of the invention to permit a straightforward cascading of said transfer logic cells to form simply wide logic operators and complex functions without triggering a corresponding dramatic increase of wiring complexity.

It is a further objective of the invention to allow logic functions not to be confined within adjacent logic blocks but rather, to be largely spread over distant building blocks whenever it is convenient to facilitate implementation.

The overall intent of the invention being to overcome the drawbacks of the traditional methods for implementing logic, exclusively from elementary gates, generating a huge amount of wiring thus, bounding the upper speed of operation while requiring expensive multi-layer metal interconnection technologies.

SUMMARY OF THE INVENTION

The invention first discloses a Transfer Logic Cell (TLC) circuit for performing logic elementary operations between a dual-rail input and a dual-rail output from at least one control terminal selecting a mode of operation among four logic modes. Namely:

- a 'PASS' logic mode of operation in which the information present on the dual rail input is transferred, unaffected, to the dual-rail output;
- a 'LEFT' logic mode of operation in which the information present on the left rail of the input is duplicated onto the dual-rail output;
- a 'CROSS' logic mode of operation in which the information present on the dual rail input is swapped onto the dual rail-output;
- a 'RIGHT' logic mode of operation in which the information present on the right rail of the input is duplicated onto the dual rail output.

Or, from two non-logic modes of operation:

- an 'ISOLATION' non-logic mode of operation in which output is permanently disabled;
- a 'TRANSPARENT' non-logic mode of operation in which dual-rail input and dual-rail output are permanently connected.

The invention also discloses a method for implementing logic functions with a plurality of TLC circuits which is characterized in that TLC circuits are cascaded, connecting one dual-rail output of one circuit to the dual-rail input of one or more circuits thus, forming an assemblage of TLC circuits in which conducting paths are established such as the paths are dependent upon the logic states present on the control terminals and of the logic function carried out by the assemblage, the logic states present on the dual-rail output of any circuit of the assemblage, located either at end point of paths or at intermediate points of paths, being usable for driving other assemblages of the same or conventional boolean logic so as to carry out together logic functions.

The invention further discloses an array comprising a plurality of elements, each of them housing one or more TLC circuits adapted for carrying out the herein above method of implementing logic functions, each with a preferred orientation so circuits can easily be interconnected when combined.

DETAILED DESCRIPTION OF THE PREFERRED EMBODIMENT

The objects and advantages of the invention will be better appreciated from the following description in which the use of a new dual-rail Transfer Logic Cell (TLC) featuring four, non boolean, functional basic modes of operation namely a 'PASS', 'LEFT', 'CROSS' and 'RIGHT' modes is generalized. TLC's are simply cascaded, arranged in trees or arrays within which conducting paths are created, steered by the control terminals thus, performing logic functions. Also, TLC offers two non-logic modes of operation, aimed at facilitating block interconnections and ease-of-use in an array-like structure of TLC's. These are the 'PASS' and 'ISOLATION' modes. The first being used as a 'TRANSPARENT' mode if the corresponding control terminal is permanently asserted, allowing to use it as a connecting block between two groups of disjoint TLC's performing together a logic function. On contrary, the 'ISOLATION' mode being used to break a series of TLC's in independent pieces implementing each their own logic. Although the preferred embodiment specifically refers to semiconductor technologies and more particularly to CMOS technology it would be understood by those skilled in the art that the actual implementation could be realized from any technology permitting to implement the basic modes of operation of the TLC without departing from the spirit of the invention.

Figure 1:
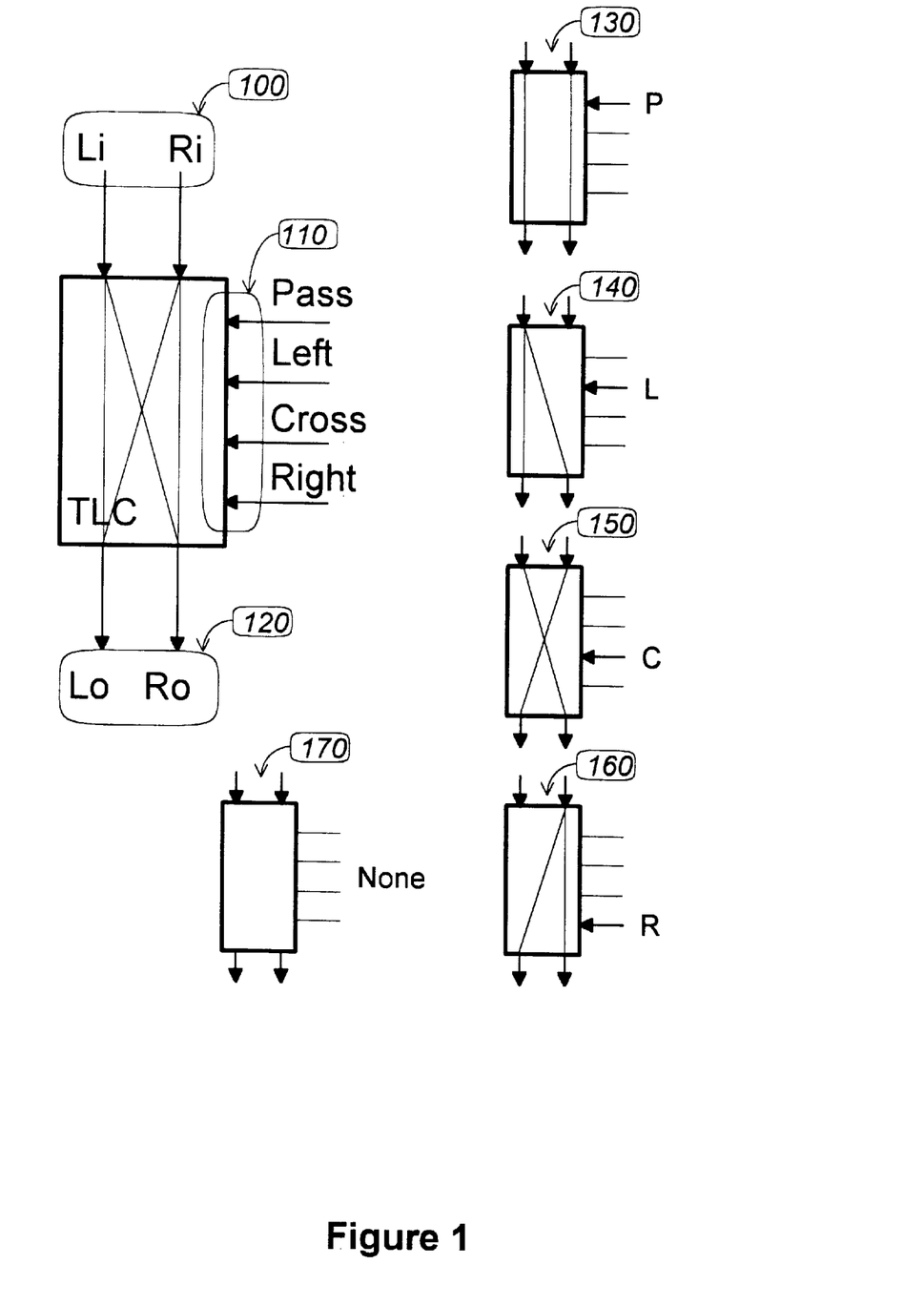
FIG. 1 describes the modes of operation of the new Transfer Logic Cell (TLC) supported from 4 mutually exclusive control terminals.

FIG. 1 depicts one form of the transfer logic cell (TLC) per the invention. TLC has a dual rail input [100] noted {Li,Ri} in the following, a dual rail output [120] noted {Lo,Ro} and four exclusive control terminals [110] to set it in one of four modes of operation. If the 'Pass' control terminal is activated the device is made transparent as shown in [130] thus, {Lo,Ro}←{Li,Ri}. If the 'Left' terminal is activated as shown in [140] what is present on {Li,} is replicated on the output so that {Lo,Ro}←{Li,} regardless of what is present on {,Ri}. The 'Cross' terminal swaps the two rails, as shown in [150], in a such a way that {Lo,Ro}←{Ri,Li}. Finally, the 'Right' terminal do the opposite of the 'Left' terminal i.e. it forces the right input to output, as shown in [160], such that {Lo,Ro}←{,Ri}. Also, it must be pointed out that if none of the control terminal is active, as shown in [170] then, output is isolated from the input and the device is turn in a non logic 'Isolation' mode while if the pass control terminal is made permanently active TLC is set in a non logic 'Transparent' mode.

Figure 2:
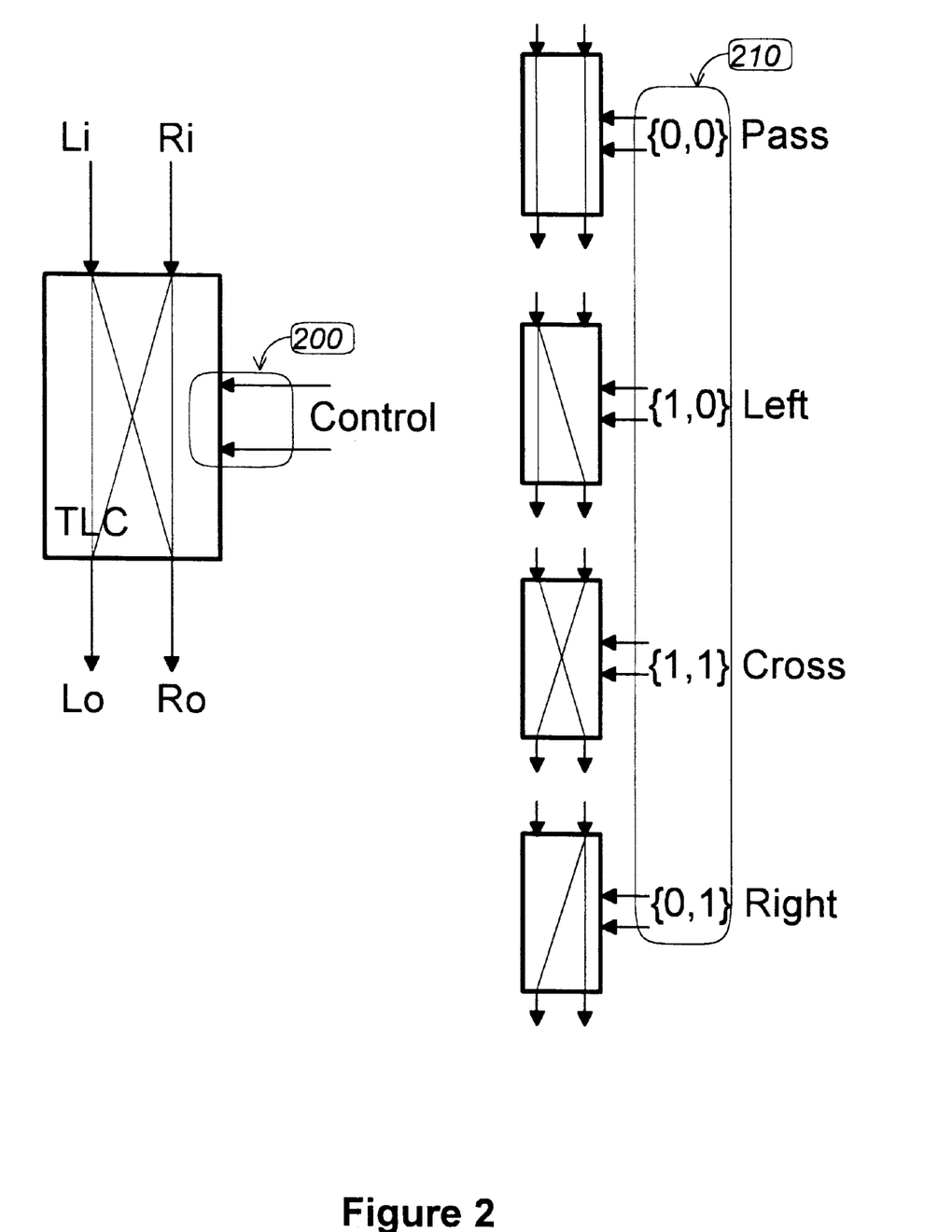
FIG. 2 describes the modes of operation of the TLC supported from two encoded control terminals.

FIG. 2 depicts an alternate way of carrying out the same function. Instead of having four exclusive control terminals the four modes of operation are encoded, as shown in [210], on two lines [200] however, without the possibility of putting the device into an isolation mode. The particular encoding of the two lines for obtaining the four modes of operation is just an example and could be different of what is shown.

Figure 3:
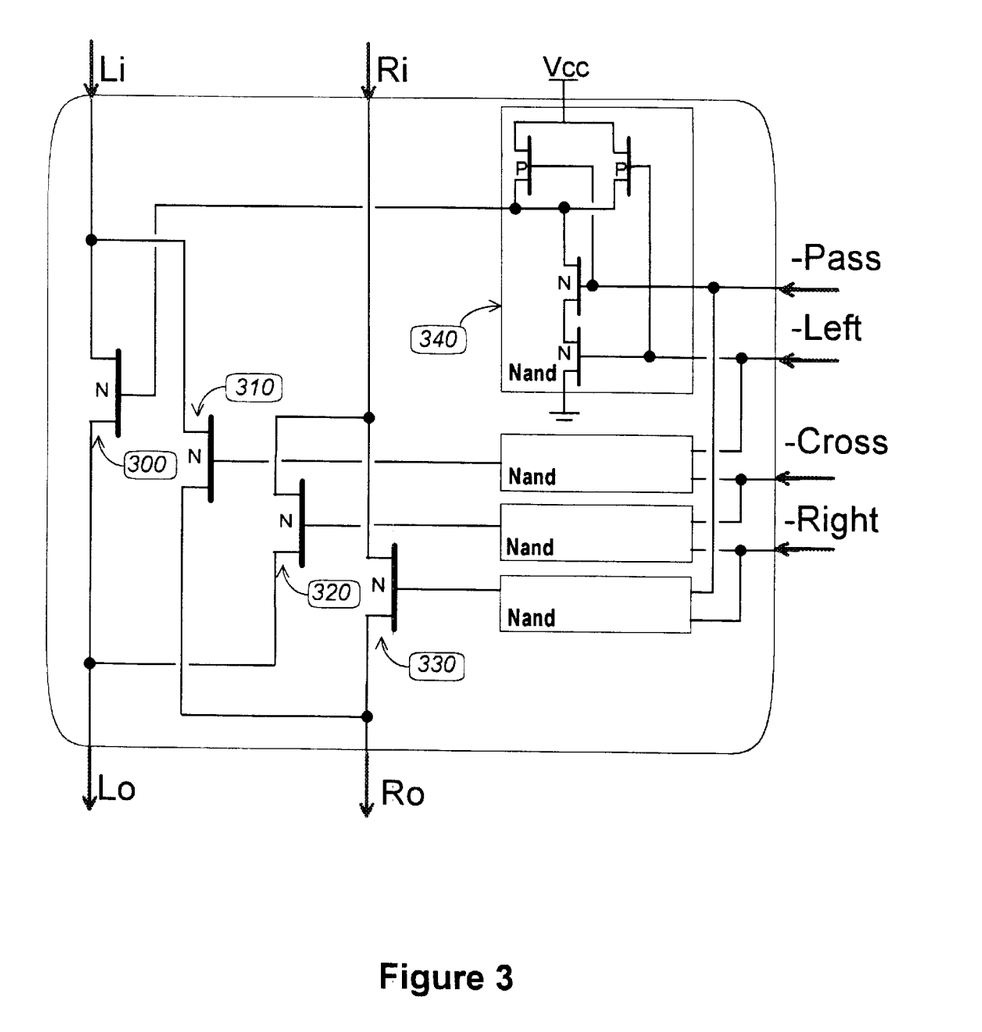
FIG. 3 is an example of implementation of the TLC based on CMOS technology with four control terminals.

FIG. 3 illustrates a possible implementation of the Transfer Logic Cell using current Complementary Metal Oxide Semiconductor (CMOS) technology, nowadays the most widely used for implementing logic functions. Obviously, numerous other possibilities may be envisioned, not even limited to the technology of the semiconductors, provided the modes of operation of TLC defined above are granted. In the particular implementation presented here the four modes of operation are carried out by enabling two out of four N-channel Field Effect Transistors of the Metal Oxide Semiconductors (MOS) type namely [300], [310], [320] and [330] thus, establishing the proper connections between input and output rails of TLC so as to implement the four modes of operation depending on which pair of transistors is activated. Turning on the transistors is achieved here with a standard 2-input CMOS NAND gate utilizing N and P channel transistors as depicted in [340], the control terminals being active at low level in this example. For each mode of operation two of the four gates have their output activated i.e. high thus, enabling the corresponding transfer devices connecting outputs to inputs.

Figure 4:
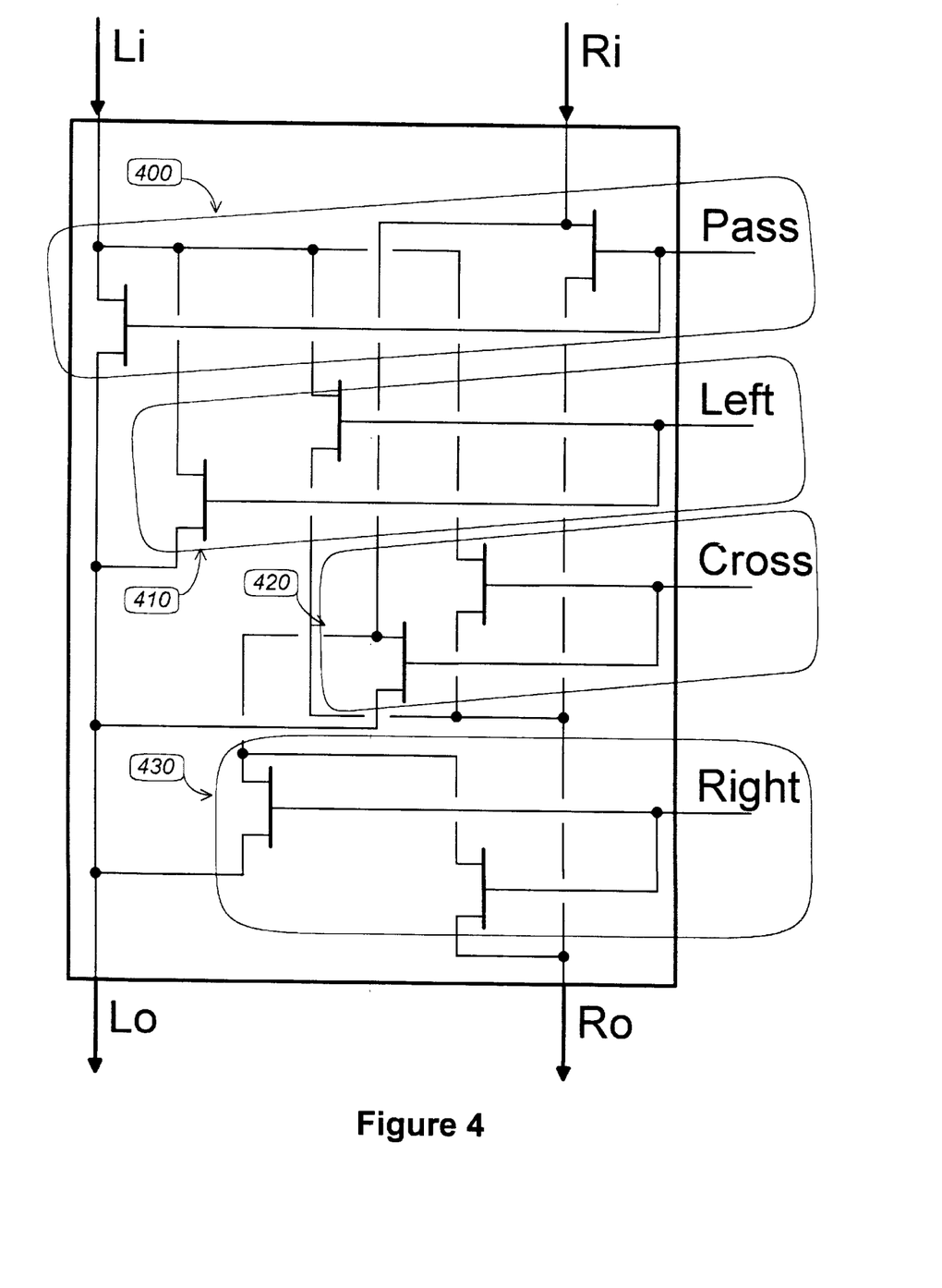
FIG. 4 is another implementation example of the TLC with four control terminals using only 8 Field Effect Transistors.

FIG. 4 depicts another simpler implementation of the TLC functions requiring only 8 transistors e.g. N-channel Field Effect Transistors, activated by pairs [400], [410], [420] and [430]. They implement the four modes of operation 'PASS', 'LEFT', 'CROSS' and 'RIGHT', without requiring the 4 NAND gates of previous (FIG. 3) implementation, along with the extra mode, already mentioned in FIG. 1, in which output is completely isolated from input.

Figure 5:
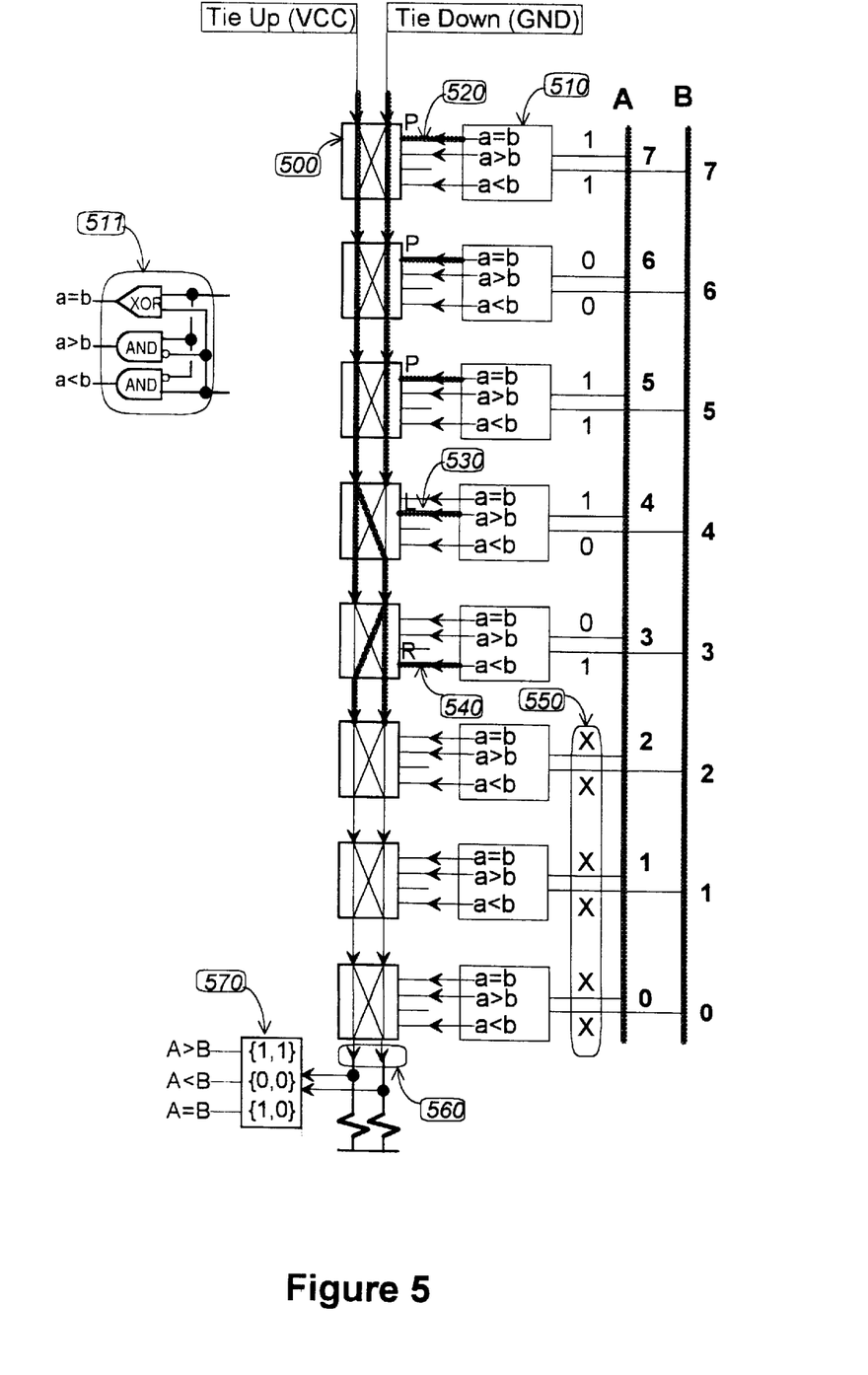
FIG. 5 shows one combination of TLC's, representative of the invention, implementing a 8-bit comparator.

FIG. 5 illustrates how TLC's are cascaded to simply perform wide logic functions. Circuit depicted in this figure implements a byte-wide comparison of two words A and B indexed from 0 to 7, the latter being the most significant bit of the word. Then, 8 TLC's [500] are cascaded i.e. one per bit of the words to compare, A and B. Each bit of the two words, with same index, are individually compared in [510] thanks to standard logic gates. An example of the expansion of block [510] is shown in [511]. Whenever the two bits are equal TLC is made transparent by activating the Pass control terminal [520]. Whenever a bit of word A is a 1 while corresponding bit of word B is a 0 in which case a>b, which occurs with bits at index 4 in this example, the left trail of input is forced to the output as it is shown in [530]. Then, all the lower situated TLC's, with a smaller index, are bounded to convey up to the bottom end a up level, on both trails, indicative of the fact that a higher significant bit has been found within A word making this word greater than B regardless of the other bit values having a lower weigh. In the opposite case i.e. when a bit of word B is a one while bit of A is a 0 instead, the right trail is forced as shown in [540], at bits index 3. This would force the propagation of a low level down to the bottom end if all the bits of both words, situated above, were equal. However, because a up level is present on both rails, as a consequence of the comparison of bits at index 3 just described a up level is forced down to the bottom end regardless of the bit values [550] at indexes 2, 1 and 0. Therefore, the result of the comparison is present on the two bottom output trails [560] and must be decoded in [570] as follows: {1,1} means that A is greater than B, {0,0} means that A is lower than B while a value of {1,0} means that A equals B.

Figure 6:
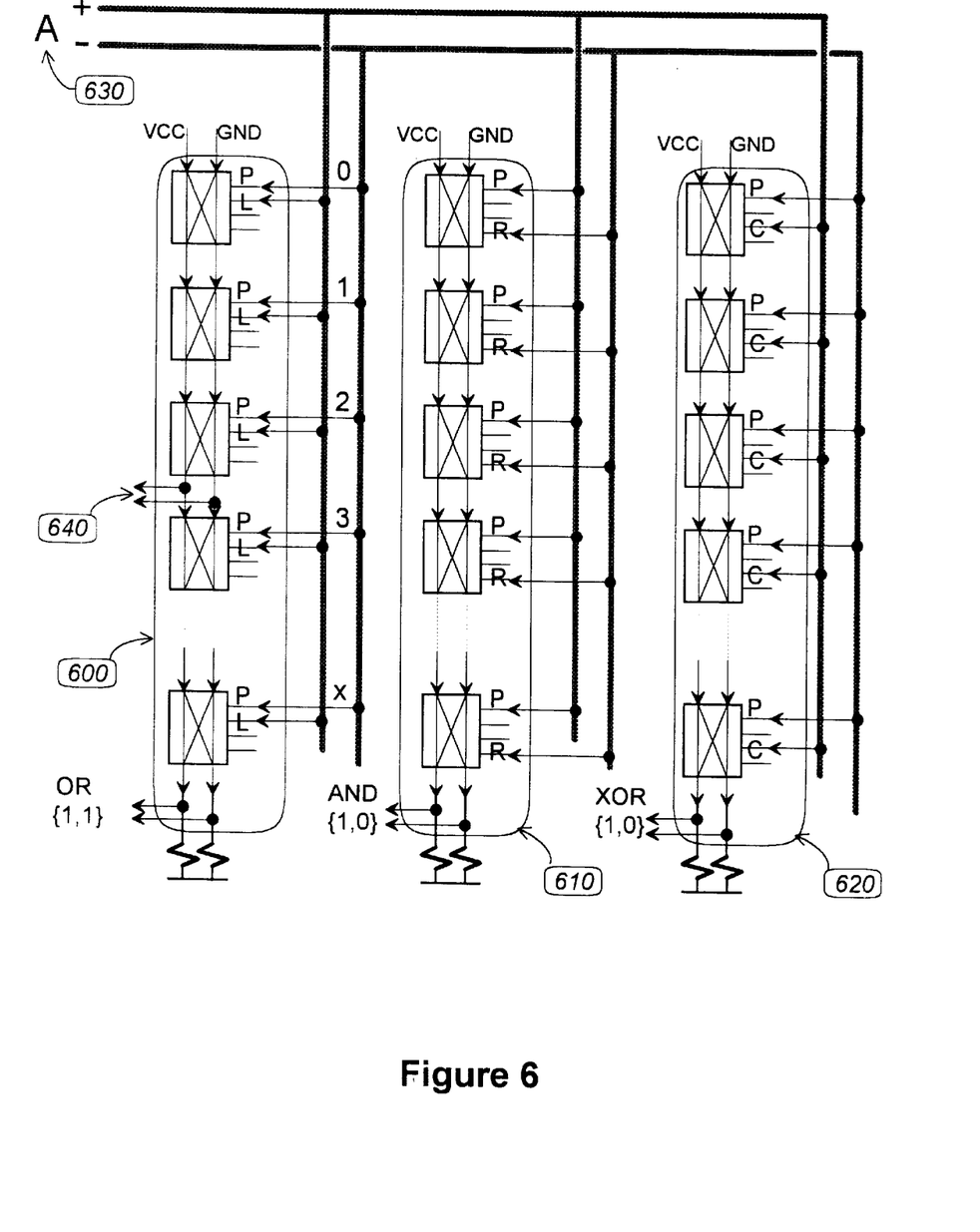
FIG. 6 depicts, for comparison, three possible uses of the same set of TLC's implementing wide boolean operators.

FIG. 6 shows how, from the same arrangement of TLC's, basic wide logic functions can be implemented. It is assumed, in this particular example, that the logical operations are performed from a common bus A [630] available in true and complement values. Then, a OR function is implemented in [600] using only the 'PASS' and 'LEFT' control terminals of TLC's. A AND function is shown in [610] which makes use of the 'PASS' and 'RIGHT' control terminals while the XOR function is similarly implemented using the 'PASS' and 'CROSS' control terminals. Obviously, logical functions can be combined into mixed functions such as AND/OR functions and partial results are usable as shown in [640] which is the OR function of bits 0–2 while the bottom result is the OR function on all bits of the A bus.

Figure 7:
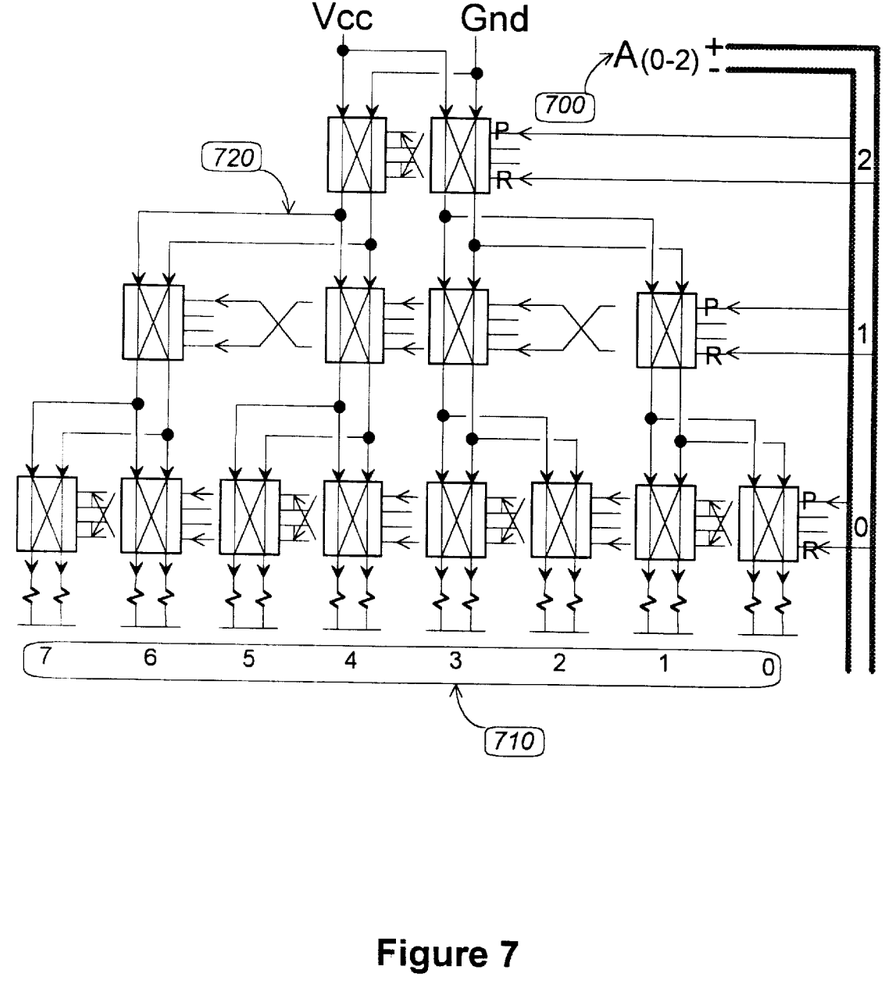
FIG. 7 shows how TLC's can be cascaded, forming a tree structure, to implement a decoder function

FIG. 7 is depicting how TLC's can be assembled in arrays or trees to implement, as an example, a standard 3 to 8 binary decoder. Depending on the value of the input, shown here under the form of a 3-bit bus A [700], available in true and complement values, only one particular path out of the 8 possible is enabled. Then, only one of the output [710] is active. In this assemblage of TLC's each of the upper TLC's is driving two others as shown in [720].

Figure 8:
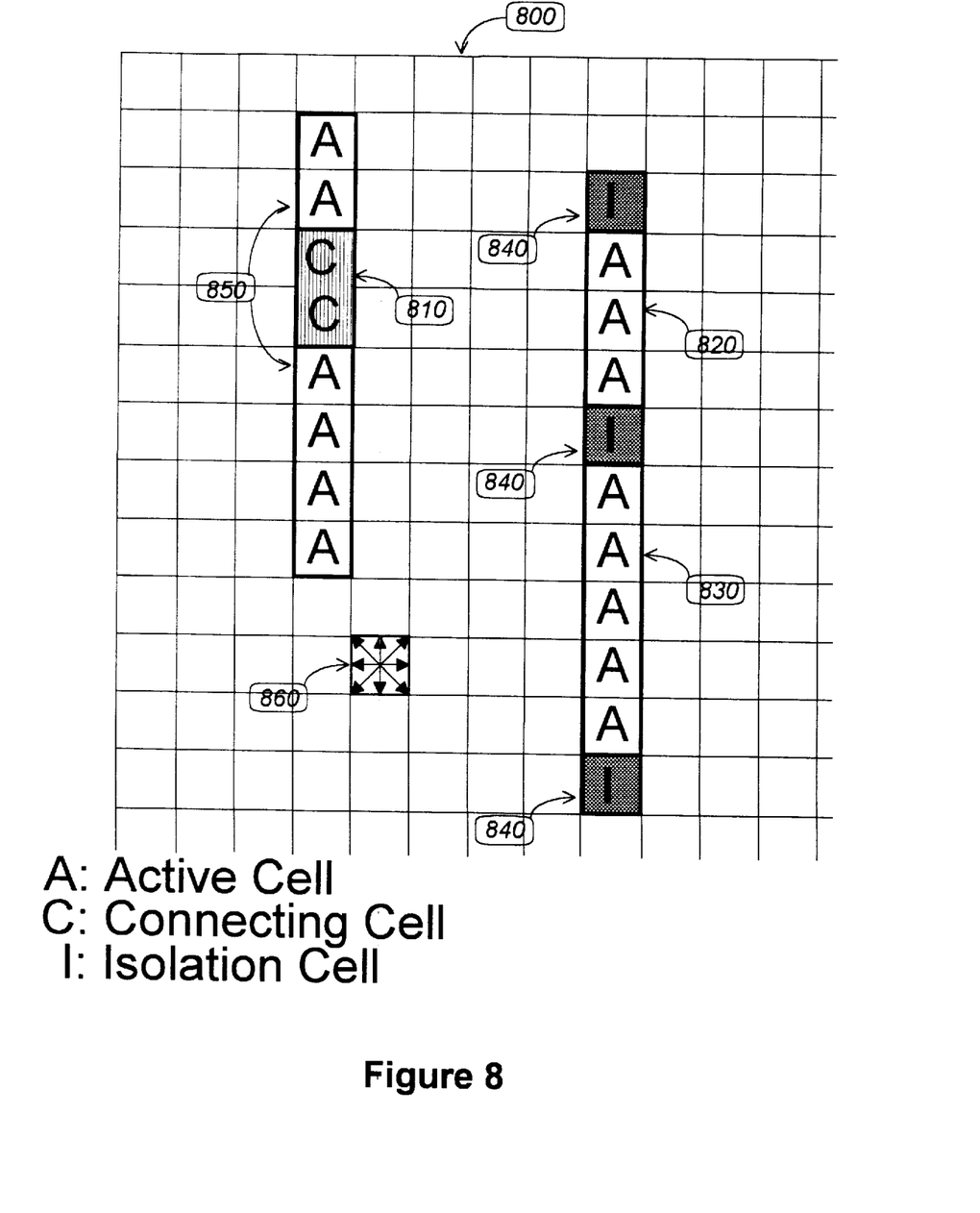
FIG. 8 shows an array of TLC's were some cells are used to implement logic while others are for isolation or interconnection of disjoint pieces of logic.

FIG. 8 illustrates one way of using TLC within an array of such circuits [800] taking advantage of the fact that TLC circuits may be used to interconnect pieces belonging to the same logic like [850] which is made of an upper and lower part interconnected through two connecting cells [810] forced permanently in 'TRANSPARENT' mode. It is worth noting here that there is no difference between the 'PASS' functional mode used by the active blocks to perform logic functions and the 'TRANSPARENT' mode for interconnections except that, in this latter mode, the pass control terminal is permanently asserted. As far as the two independent pieces of logic [820] and [830] are concerned they are isolated by the cells [840] set, permanently, in their 'ISOLATION' mode (none of the control terminals are asserted). TLC's symbolized here assume a cell layout consistent with what was used in previous figures i.e. dual-rail input on top, dual-rail output at bottom. On the array map this is referred to, in the following, as a "north-south" type of logic as illustrated in FIGS. 5, 6 and 7. However, it should be obvious to the person skilled in the art that any direction could be used as well i.e. not only from north to south but the opposite, south to north, as well and east to west or west to east and the diagonal directions either. Moreover, all those directions, or a subset of, may coexist in a N-way TLC cell [860], implementing the TLC modes described herein in N directions so that, in an array of such TLC's any pattern of cells to form logic can be created on top of what is shown in FIG. 8 which is limited, for the sake of clarity, to the "north-south" type of logic of previous figures.

What is claimed is:

1. A circuit for performing logic elementary operations between a dual-rail input and a dual-rail output from at least one control terminal, said circuit comprising:

means for selecting a mode of operation upon assertion of one or a plurality of signals on one or a plurality of control terminals;

means for operating the circuit in a 'PASS' logic mode of operation in which the information present on the dual rail input is transferred, unaffected, to the dual-rail output;

means for operating the circuit in a 'LEFT' logic mode of operation in which the information present on the left rail of the input is duplicated onto the dual-rail output;

means for operating the circuit in a 'CROSS' logic mode of operation in which the information present on the dual rail input is swapped onto the dual rail-output;

means for operating the circuit in a 'RIGHT' logic mode of operation in which the information present on the right rail of the input is duplicated onto the dual rail output.

2. The circuit of claim 1 further operating in an 'ISOLATION' non-logic mode of operation in which none of the means for enabling the 'PASS', 'LEFT', 'CROSS' or 'RIGHT' logic modes of operation is ever activated so that output is permanently disabled.

3. The circuit of claim 1 further operating in a 'TRANSPARENT' non-logic mode of operation in which means for enabling the 'PASS' logic mode of operation is always activated so that dual-rail input and dual-rail output are permanently connected.

4. The circuit of claim 2 having any subset of the logic and non-logic modes of operation.

5. A method for implementing logic functions with a plurality of circuits comprising the steps of:
   cascading said circuits, connecting one dual-rail output of one circuit to the dual-rail input of one or more circuits thus, forming an assemblage of said circuits;
   establishing conducting paths within the assemblage of said circuits from the selecting means of each circuit such as the paths are dependent upon the logic states present on the control terminals of said selecting means and of the logic function carried out by the assemblage;
   using the states present on the dual-rail output of any circuit of the assemblage, located either at end point of paths or at intermediate points of paths for driving other assemblages of the same or conventional boolean logic so as to carry out the logic functions.

6. A method of implementing logic functions as in claim 5 by creating an array having a plurality of elements each of said element including one or more circuits forming the assemblage.

7. A method of implementing logic functions as in claim 6 by creating an array having in each element four circuits, one for each of the four cardinal directions in the map of circuits forming the array namely north, east, south and west directions so that north to south, east to west, south to north and west to south paths, or part of, can be formed within the array.

8. The array of claim 7 including also the northwest, northeast, southeast and southwest directions so that every element of the array can be combined with any of its surrounding neighbor.

9. The array of claim 6 including circuits used in one of its non logical modes, to begin or to terminate a path, in an array of said circuits.

10. The circuit of claim 2 further operating in a 'TRANSPARENT' non-logic mode of operation in which means for enabling the 'PASS' logic mode of operation is always activated so that dual-rail input and dual-rail output are permanently connected.

11. The array of claim 6 including circuits used in one of its non logical modes to connect permanently two pieces of the same logic function without altering said logic behavior.

* * * * *